US010505489B2

(12) United States Patent
Ilic et al.

(10) Patent No.: US 10,505,489 B2
(45) Date of Patent: *Dec. 10, 2019

(54) POWER MODULE FOR AN ELECTRIC MOTOR

(71) Applicant: Robert Bosch GmbH, Stuttgart (DE)

(72) Inventors: Erich Ilic, Lichtenstein (DE); Johannes Hirschle, Mehrstetten (DE); Walter Von Emden, Enigen unter Achalm (DE); Volker Betz, Moessingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/779,240

(22) PCT Filed: Nov. 17, 2016

(86) PCT No.: PCT/EP2016/074869
§ 371 (c)(1),
(2) Date: May 25, 2018

(87) PCT Pub. No.: WO2017/089028
PCT Pub. Date: Jun. 1, 2017

(65) Prior Publication Data
US 2018/0351498 A1    Dec. 6, 2018

(30) Foreign Application Priority Data

Nov. 27, 2015   (DE) .......................... 10 2015 223 602

(51) Int. Cl.
*H01L 23/495*    (2006.01)
*H02P 27/04*    (2016.01)
(Continued)

(52) U.S. Cl.
CPC ........ *H02P 27/04* (2013.01); *H01L 23/49534* (2013.01); *H01L 23/49537* (2013.01);
(Continued)

(58) Field of Classification Search
CPC .................. H01L 23/49575; H01L 23/49534
See application file for complete search history.

(56) References Cited

FOREIGN PATENT DOCUMENTS

| EP | 2 477 222 A2 | 7/2012 |
| EP | 2 546 874 A1 | 1/2013 |

(Continued)

OTHER PUBLICATIONS

International Search Report corresponding to PCT Application No. PCT/EP2016/074869, dated Jan. 5, 2017 (German and English language document) (5 pages).

*Primary Examiner* — Moazzam Hossain
*Assistant Examiner* — Hajar Kolahdouzan
(74) *Attorney, Agent, or Firm* — Maginot, Moore & Beck LLP

(57) ABSTRACT

A power module for an electric motor includes at least one semiconductor switch half bridge. The half bridge includes a high-side semiconductor switch and a low-side semiconductor switch. Each switch has a contact gap terminal formed by a surface region of the switch, in particular a flat surface region. The contact gap terminals, in particular a normal vector of the terminals, each points in a same direction. At least one electrically conductive layer is enclosed between the switches and electrically connects the contact gap terminal of the low-side semiconductor switch and the contact gap terminal of the high-side semiconductor switch of the half bridge to each other. Preferably an output terminal of the half bridge is formed by at least one electrically conductive layer.

11 Claims, 7 Drawing Sheets

(51) Int. Cl.
*H02G 5/06* (2006.01)
*H03K 17/567* (2006.01)
*H05K 5/02* (2006.01)

(52) U.S. Cl.
CPC .. *H01L 23/49562* (2013.01); *H01L 23/49575* (2013.01); *H02G 5/06* (2013.01); *H03K 17/567* (2013.01); *H05K 5/0217* (2013.01); *H01L 2224/40* (2013.01); *H03K 2217/0063* (2013.01); *H03K 2217/0072* (2013.01)

(56) References Cited

FOREIGN PATENT DOCUMENTS

| | | |
|---|---|---|
| JP | 2013-168475 A | 8/2013 |
| JP | 2014-154770 A | 8/2014 |
| JP | 2015-109756 A | 6/2015 |

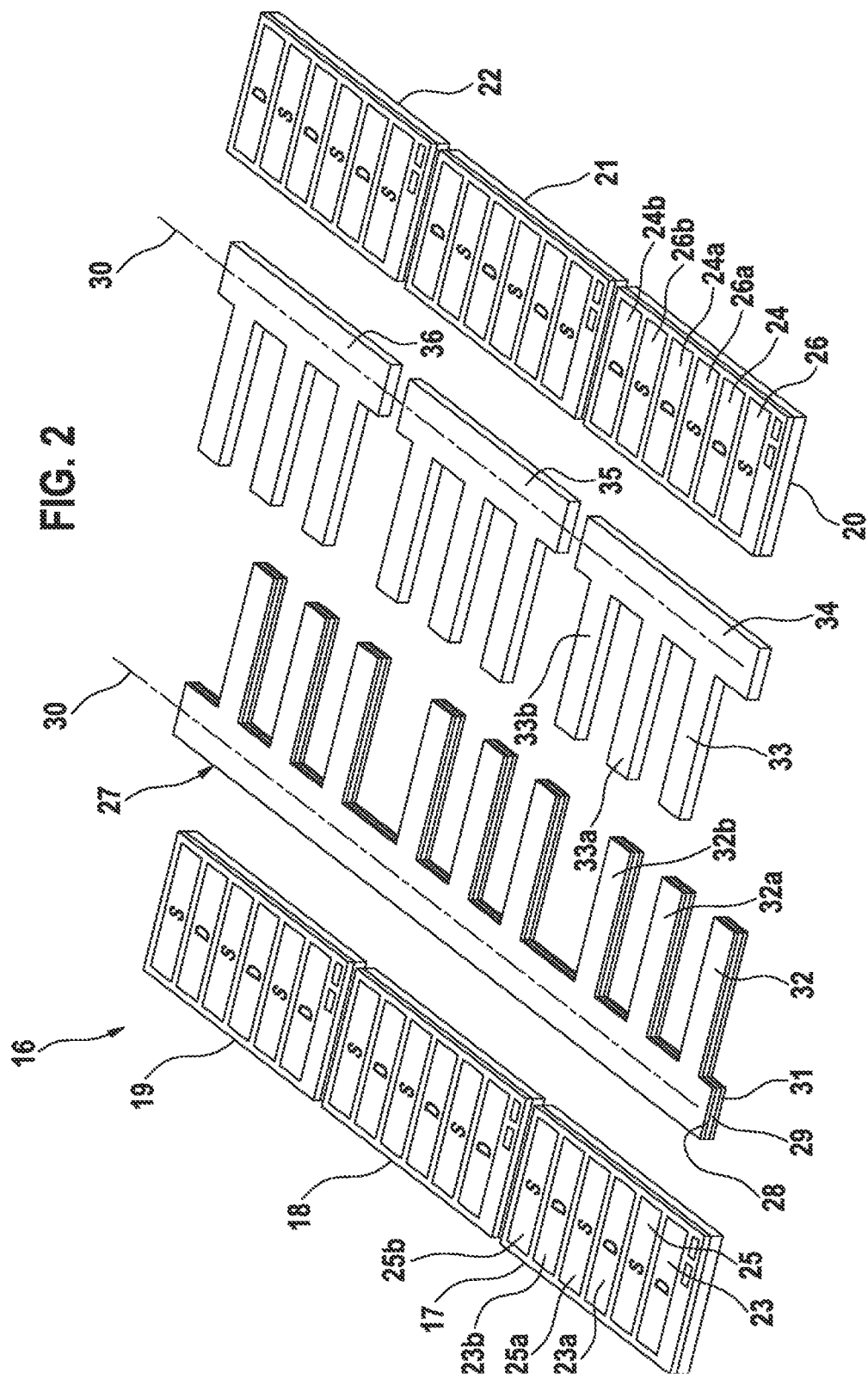

POWER MODULE FOR AN ELECTRIC MOTOR

This application is a 35 U.S.C. § 371 National Stage Application of PCT/EP2016/074869, filed on Oct. 17, 2016, which claims the benefit of priority to Serial No. DE 10 2015 223 602.1, filed on Nov. 27, 2015 in Germany, the disclosures of which are incorporated herein by reference in their entirety.

BACKGROUND

The disclosure relates to a power module for an electric motor. The power module has at least one semiconductor switch half-bridge.

SUMMARY

According to the disclosure, the semiconductor switch half-bridge has a high-side semiconductor switch and a low-side semiconductor switch, wherein the semiconductor switches of the half-bridge have in each case switching path terminals formed by a surface region of the semiconductor switch, said surface region being embodied in particular in a flat fashion. The switching path terminals, in particular a surface normal vector of the switching path terminal, in each case face in the same direction. The high-side semiconductor switch and the low-side semiconductor switch enclose between one another at least one electrically conductive layer, which electrically connects a switching path terminal of the low-side semiconductor switch and a switching path terminal of the high-side semiconductor switch of the half-bridge to one another. Preferably, an output terminal of the half-bridge is formed by at least one electrically conductive layer. A compact power module can advantageously be provided by means of such a construction. The power module can thus be arranged in a space-saving manner in an electric motor.

In one preferred embodiment of the power module, the switching path terminal of the semiconductor switches of a half-bridge are situated opposite one another. Preferably, the switching path terminals of a semiconductor switch are arranged in a coplanar manner with respect to one another. The switching path terminals connected to one another by means of the electrically conductive layer can thus enclose between one another the electrically conductive layer—in particular in the manner of a sandwich. In this regard, the power module can advantageously be constructed in a space-saving manner.

In one preferred embodiment, the power module is designed for polyphase switching, in particular switching of motor currents, and has at least one or only one semiconductor switch half-bridge for each phase. The power module can thus have three semiconductor switch half-bridges for example for driving a three-phase motor. Each semiconductor switch half-bridge can have for example a plurality or a multiplicity of individual semiconductor switch half-bridges which are connected in parallel with one another, in particular are arranged as a string.

The semiconductor switch half-bridge preferably has for each switching path terminal at least two, three or four, or more than four surface regions which are embodied as electrically conductive and are connected to the switching path terminal. The surface regions can thus in each case form a contact pad.

In one preferred embodiment of the power module, the electrically conductive layer has a phase busbar, onto which at least one contact finger pointing away from the phase busbar transversely or with a transverse component is integrally formed in a flat extension of the layer. The contact finger preferably connects to one another the switching path terminals of the semiconductor switches that are connected to the output terminal. The contact rail can thus advantageously form a busbar which concentrates the currents led away by the contact fingers or which distributes a current among the contact fingers, wherein the distributed current can be led to the switching path terminals by means of the contact fingers.

With further advantage, the busbar can project from a power module formed by a moulded module, for example, from a moulded body of the moulded module, and can thus be electrically contacted externally.

In one preferred embodiment, the semiconductor switches are formed in each case by a field effect transistor, wherein that switching path terminal of the high-side semiconductor switch which is connected to the output terminal of the half-bridge is a source terminal and that switching path terminal of the low-side semiconductor switch which is connected to the output terminal of the half-bridge is a drain terminal. In this regard, a semiconductor switch half-bridge, formed from two MOS field effect transistors (MOS=Metal Oxide Semiconductor), or MIS field effect transistors (MIS=Metal Insulator Semiconductor), can advantageously be constructed in a compact and space-saving manner. With further advantage, the power module can have a low inherent inductance as a result of the compact construction.

In one preferred embodiment, the semiconductor switches are formed in each case by an IGBT (IGBT=Insulated Gate Bipolar Transistor), wherein that switching path terminal of the high-side semiconductor switch which is connected to the output terminal of the half-bridge is an emitter terminal and that switching path terminal of the low-side semiconductor switch which is connected to the output terminal of the half-bridge is a collector terminal. The half-bridge can thus—consisting of IGBT transistors—advantageously be constructed in a space-saving manner.

In one preferred embodiment, the contact finger comprises two electrically conductive layers which are arranged parallel to one another and which are separated from one another by an electrically insulating insulation layer. The layers of the contact finger preferably contact mutually opposite terminals of mutually different semiconductor switches. In this regard, advantageously, from the interspace extending between the low-side semiconductor switch and the high-side semiconductor switch, the half-bridge, in particular the semiconductor switches of the half-bridge, can be supplied with voltage in a space-saving manner and with low inductance.

Preferably, the electrically insulating insulation layer is formed by a dielectric. The dielectric is, for example, a polyimide layer or a polyamide layer. In this way, a link capacitor—corresponding to the surface of the two electrically conductive layers which are arranged parallel to one another—can advantageously be formed, which is thus integrated in the power module.

In one preferred embodiment, the contact fingers of the phase busbar and of the busbar in each case intermesh. In this way, the feeding-in of current and the feeding-out of current from the power module can be embodied in a particularly compact fashion.

BRIEF DESCRIPTION OF THE DRAWINGS

The disclosure will now be described below on the basis of figures and further exemplary embodiments. Further advantageous embodiment variants are evident from the features described in the dependent claims and in the figures.

FIG. 2 shows—schematically in an exploded illustration—a semiconductor arrangement for forming three semiconductor switch half-bridges, formed from FET transistors, wherein electrical contacts for feeding in current and feeding out current are enclosed between the low-side and high-side transistors;

DETAILED DESCRIPTION

Figure 1:
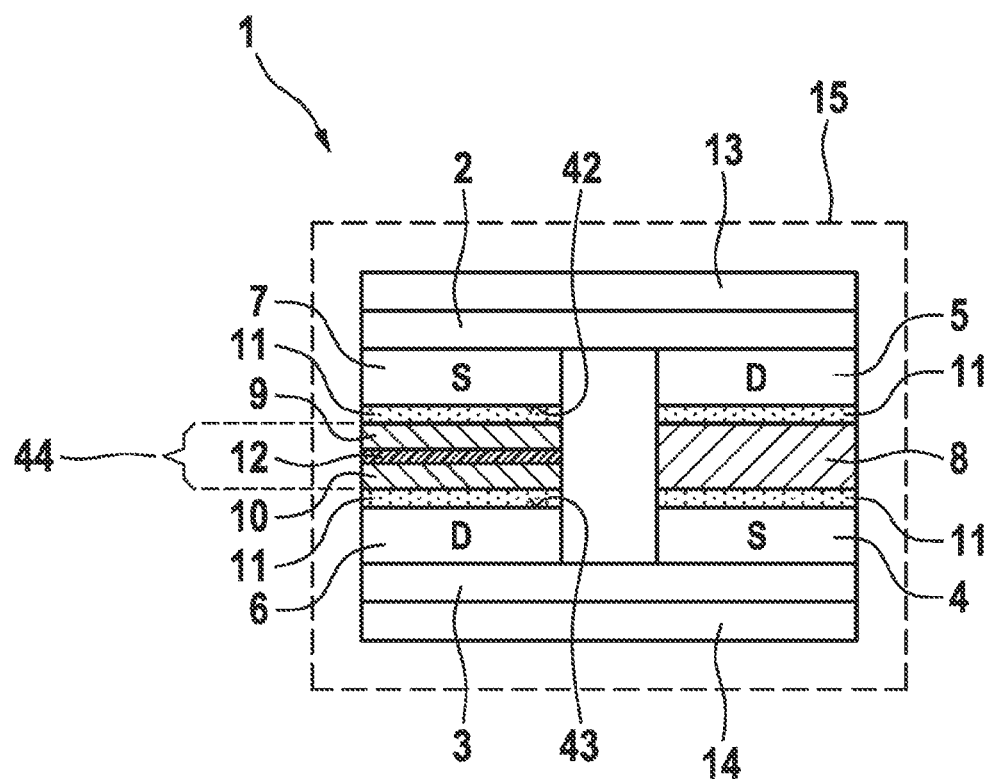
FIG. 1 shows—schematically—an exemplary embodiment of a semiconductor arrangement which forms a semiconductor switch half-bridge in which two semiconductor switches enclose between one another electrical contacts for feeding in current and feeding out current.

FIG. 1 shows an exemplary embodiment of a semiconductor arrangement 1. In this exemplary embodiment, the semiconductor arrangement 1 forms a power module comprising a semiconductor switch half-bridge. In this exemplary embodiment, the semiconductor switch half-bridge comprises a low-side semiconductor switch 2 and a high-side semiconductor switch 3. The low-side semiconductor switch 2, which is formed by a field effect transistor in this exemplary embodiment, has a source terminal 7 as switching path terminal and a drain terminal 5 as further switching path terminal. The high-side semiconductor switch 3 has a drain terminal 6 as switching path terminal and a source terminal 4 as further switching path terminal. The source terminal 4 of the high-side semiconductor switch 3 is electrically connected to the drain terminal 5 of the low-side semiconductor switch. The semiconductor switches 2 and 3 are in each case embodied in a flat fashion. The source terminal 7 has a surface region 42 arranged opposite a surface region 43 of the drain terminal 6 of the high-side semiconductor switch 3. The source terminal 7 and the drain terminal 5 of the low-side semiconductor switch 2 in each case extend in a common plane.

The drain terminal 5 of the low-side semiconductor switch and the source terminal 4 of the high-side semiconductor switch 3 enclose between one another an output terminal 8 and in each case are electrically connected to the output terminal 8 cohesively or by a material joint by means of an electrical connection means 11. The connection means 11 is, for example, a solder, a sintering solder connection or an electrically conductive adhesive. In this exemplary embodiment, the output terminal 8 is formed by a sheet-metal piece extending in a flat fashion or sheet-metal strips, also known as a lead frame. The output terminal 8 is formed by copper or silver sheet metal, for example. The output terminal 8 can be formed by a contact finger, for example.

In this exemplary embodiment, the source terminal 7 is connected to an electrically conductive layer 9 by means of a connection means 11, in particular solder, electrically conductive adhesive or sintering metal. The electrically conductive layer 9 can form for example an output terminal for supplying the semiconductor switch half-bridge with current. The drain terminal 6 is connected to an electrically conductive layer 10 by means of a connection means 11, in particular solder or electrically conductive adhesive or sintering metal. In this exemplary embodiment, the electrically conductive layer 10 forms a further terminal for supplying the semiconductor switch half-bridge with current. In this exemplary embodiment, the electrically conductive layers 9 and 10 are arranged parallel and at a distance from one another and enclose between one another an electrically insulating layer 12. The electrically conductive layers 9 and 10 are thus electrically insulated from one another.

The source terminal 7 and the drain terminal 6 thus enclose between one another the electrically conductive layers 9 and 10 and the electrically insulating layer 12—enclosed between the electrically conductive layers 9 and 10 in the manner of a sandwich. The surface region of the source terminal 7 is thus electrically contacted by the electrically conductive layer 9 and the surface region 43 of the drain terminal 6 is electrically contacted by the electrically conductive layer 10. The electrically conductive layers 9 and 10 are led toward the outside, for example, such that the semiconductor switch can thus be electrically contacted externally.

The semiconductor switch half-bridge thus formed, which is constructed in a compact fashion, can be embedded into a moulded body 15. The output terminal 8, embodied for example as an electrically conductive layer, projects from the moulded body 15 in this exemplary embodiment. The electrically conductive layer 9, the electrically conductive layer 10 and the insulation layer 12 enclosed therebetween together can form a busbar 44 or part of a busbar and project jointly from the moulded body 15. The semiconductor switch half-bridge can thus be supplied with current via the busbar 44, wherein the current—switched by the low-side semiconductor switch 2 and the high-side semiconductor switch 3—can flow away via the output terminal 8.

The low-side semiconductor switch 2 has an outwardly facing insulation layer 13, via which heat loss generated in the semiconductor switch 2 can be dissipated. The high-side semiconductor switch 3 has an outwardly facing insulation layer 14, via which heat loss generated in the semiconductor switch 2 can be dissipated. Heat dissipation from the half-bridge comprising the semiconductor switches 2 and 3 can thus advantageously be effected via two sides facing away from one another. The insulation layers 13 and 14 can be formed in each case by a ceramic layer, DBC layer (DBC=Direct Bonded Copper), in which a copper layer for cohesive connection, in particular soldering or sintering, to a heat sink faces outward. A heat sink, for example a cooling body, can be coupled to the insulation layers 13 and 14, which are formed by a polyimide layer, for example, by means of a thermally conductive adhesive.

FIG. 2 shows—schematically—parts of a semiconductor arrangement 16, in an exploded illustration. In this exemplary embodiment, the semiconductor arrangement 16 forms a power module having three semiconductor switch half-bridges for driving a three-phase electric motor or a three-phase electric machine. In this exemplary embodiment, the semiconductor arrangement 16 comprises three high-side semiconductor switches, namely a high-side field effect transistor 17, a high-side field effect transistor 18 and a high-side field effect transistor 19. The field effect transistors 17, 18 and 19 are in each case embodied in a flat fashion, wherein the switching path terminals, in particular a drain terminal 23 and a source terminal 25, in each case face—with their flat extension—in the same direction.

The drain terminal 23 of the semiconductor switch 17 is also formed by two further terminal parts 23a and 23b. The source terminal of the semiconductor switch 17 also comprises, besides the source terminal 25, two further terminal parts 25a and 25b, which are formed in each case by a surface region of the semiconductor switch 17.

The surface regions which form the source terminal and the drain terminal of the semiconductor switch 17 alternate along a longitudinal axis 30 alternately with one another. In this regard, along the longitudinal axis 30, the surface region which forms the source terminal 25 is arranged adjacently to the surface region which forms the drain terminal 23. The surface region which forms the source terminal 25 is followed by the surface region which forms the drain terminal part 23a. Along the longitudinal axis, the drain terminal part 23a is followed by the source terminal part 25a, and the source terminal part 25a is followed by the drain terminal part 23b. The drain terminal part 23b is followed by the source terminal part 25b. In this regard, two source terminal parts arranged along the longitudinal axis 30 enclose a drain terminal part between one another, and drain terminal parts arranged along the longitudinal axis 30 enclose a source terminal part between one another.

The semiconductor arrangement 16 also comprises a busbar which, in this exemplary embodiment, comprises two electrically conductive layers 28 and 31 which are arranged parallel to one another and are electrically isolated from one another by means of an insulation layer 29. The busbar 27 extends along the longitudinal axis 30. Contact fingers such as the contact finger 32 are integrally formed onto the busbar 27 at a distance from one another along the longitudinal axis 30, wherein the contact fingers respectively—like the busbar 27—comprise the electrically conductive layers 28 and 31 and the insulation layer 29 arranged therebetween. The busbar and the contact fingers integrally formed onto the busbar 27 thus comprise two contact planes which are arranged parallel to one another and are electrically isolated from one another by means of the insulation layer 29.

The electrically conductive layer 31 of the contact finger 32 is designed to be soldered with the drain terminal 23. In this exemplary embodiment, two further contact fingers 32a and 32b spaced apart from one another along the longitudinal axis 30 are also integrally formed onto the busbar 27. The electrically conductive layer 31 of the contact finger 32a is designed to be electrically connected, in particular soldered, for example reflow-soldered, to the drain terminal 23a. The electrically conductive layer 31 of the contact finger 32b is designed to be soldered to the drain terminal 23b. The busbar 27, in particular the electrically conductive layer 31 of the busbar 27, can thus be electrically connected to the drain terminal, in particular the drain terminal parts 23, 23a and 23b, of the semiconductor switch 17 by means of the contact fingers 32, 32a and 32b. The semiconductor switch 17 can thus be electrically connected to an electrical voltage source, in particular a positive pole of the voltage source, by means of the busbar 27.

The semiconductor arrangement 16 also comprises a low-side semiconductor switch 20, which is designed to form a semiconductor switch half-bridge together with the high-side semiconductor switch 17. The semiconductor arrangement 16 also comprises a semiconductor switch 21 designed to form a semiconductor switch half-bridge together with the high-side semiconductor switch 18, and a further low-side semiconductor switch 22 designed to form a semiconductor switch half-bridge together with the high-side semiconductor switch 19.

The semiconductor arrangement 16 also comprises an output terminal 34, which in this exemplary embodiment is embodied as—for example stamped or laser-cut—sheet-metal piece, also known as a lead frame. The output terminal 34 comprises a busbar extending along the longitudinal axis 30 and contact fingers 33, 33a and 33b integrally formed onto the busbar at a distance from one another along the longitudinal axis 30.

The contact finger 33 is designed to be soldered by a flat side to the source terminal 25 of the high-side semiconductor switch 17 and to be soldered by an opposite side relative thereto to a drain terminal 24 of the low-side semiconductor switch 20. A source terminal 26 of the low-side semiconductor switch 20, said source terminal being arranged adjacently to the drain terminal 24 along the longitudinal axis 30, is designed to be soldered to the electrically conductive layer 28 of the contact finger 32, such that the source terminal 26 can be connected to a pole of a voltage source, in particular the negative pole of the voltage source, via the busbar 27, in particular the electrically conductive layer 28 of the busbar 27.

The contact finger 33a is designed to be soldered to the source terminal 25a, and the contact finger 33b is designed to be connected to the source terminal 25b.

The contact finger 33 of the output terminal 34 thus connects the source terminal 25 of the high-side semiconductor switch 17 to the drain terminal 24 of the low-side semiconductor switch 20 and a partial terminal 24a of the drain terminal 24 to the partial terminal 25a of the source terminal 25. The contact finger 33b connects the partial terminal 24b of the drain terminal of the low-side semiconductor switch 20 to the partial terminal 25b of the source terminal 25 of the high-side semiconductor switch 17. The contact fingers 33, 33a and 33b of the output terminal 34 are thus enclosed—in the manner of a sandwich—between the semiconductor switches each extending in a flat fashion, namely the high-side semiconductor switch 17 and the low-side semiconductor switch 20.

Still further contact fingers for electrically contacting the high-side semiconductor switch 18 and another three further contact fingers for electrically contacting the high-side semiconductor switch 19 are integrally formed onto the busbar 27.

The semiconductor arrangement 16 also comprises an output terminal 35 for the semiconductor switch half-bridge, comprising the high-side semiconductor switch 18 and the low-side semiconductor switch 21, and an output terminal 36 for the half-bridge, comprising the high-side semiconductor switch 19 and the low-side semiconductor switch 22. Thus a phase of an electric machine, in particular a stator coil of the electric machine, can be respectively connected to the output terminals 34, 35 and 36.

The contact fingers of the busbar 27 and the contact fingers of the output terminal, such as the output terminal 34, 35 or 36, are in each case designed to intermesh in a flat extension. The contact fingers of the busbar and of the output terminal are thus arranged in a common plane and can be enclosed jointly between the high-side semiconductor switch 17 and the low-side semiconductor switch 20—in particular in the manner of a sandwich.

In another embodiment, the semiconductor switches 17, 18, 19, 20, 21 and 22 may be embodied in each case as an IGBT. The source terminal then corresponds to an emitter terminal, and the drain terminal corresponds to a collector terminal.

The semiconductor switches have in each case a—not illustrated in FIG. 2—control terminal, in particular gate terminal, and are in each case designed to receive a control signal for turning on the semiconductor switch at the gate terminal and to turn on or to turn off the semiconductor switch depending on the control signal. The gate terminal can be formed for example by an insulated region of the busbar 27.

Figure 3:
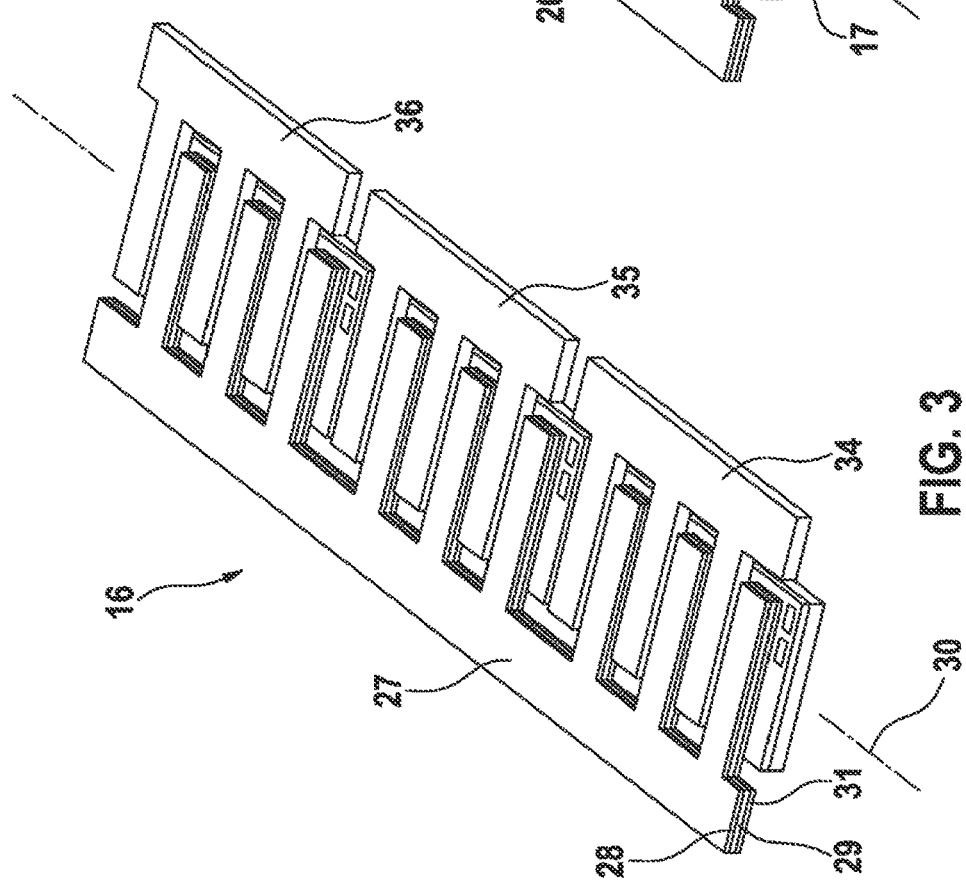
FIG. 3 shows a production step for forming a power module comprising the components illustrated in FIG. 2, wherein the high-side transistors are soldered with electrical terminals, in particular a busbar and output terminals.

FIG. 3 shows a production step for producing a power module, comprising the parts already illustrated in FIG. 2 for the semiconductor arrangement 16 illustrated in FIG. 2. In the production step illustrated in FIG. 3 the contact fingers of the busbar 27 are placed with the electrically conductive layer 31 onto the switching path terminals of the high-side semiconductor switches such as the semiconductor switch 17, the semiconductor switch 18 and the semiconductor switch 19 and are electrically and cohesively connected—for example by means of a solder paste and reflow soldering. The contact fingers of the output terminal 34 are placed onto the corresponding switching path terminals—as already described in FIG. 2—of the high-side semiconductor switch 17 and are soldered to the corresponding switching path terminals by a solder paste—as described in FIG. 1.

In the same step as illustrated in FIG. 3, the output terminal 35 can be soldered to the high-side semiconductor switch 18 and the output terminal 36 can be soldered to the high-side semiconductor switch 19.

Figure 4:
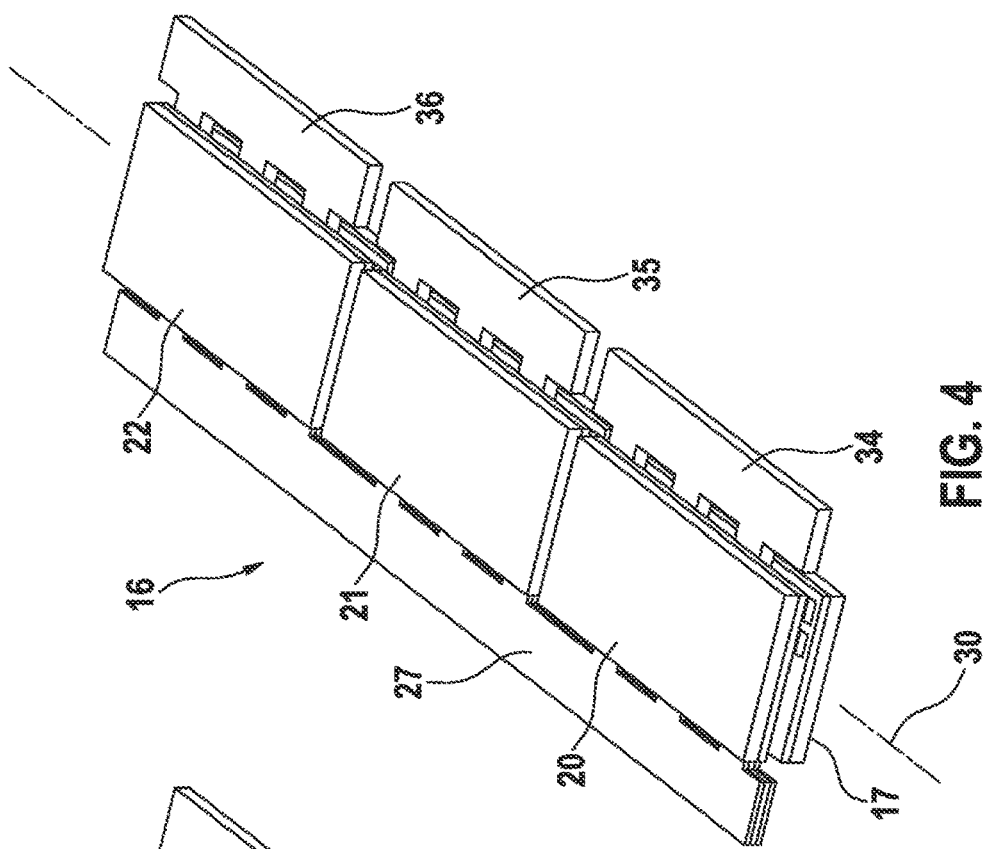
FIG. 4 shows a production step for forming a power module comprising the components illustrated in FIG. 3, wherein low-side semiconductor switches are soldered with electrical terminals, in particular the busbar and the output terminals.

FIG. 4 shows a production step for producing the power module comprising the components illustrated in FIG. 2, in which the low-side semiconductor switches 20, 21 and are placed onto the busbar 27 and onto the output terminals 34, 35 and 36 and are soldered to the busbar 27 and the output terminals.

The output terminal 34 thus connects the source terminal of the high-side semiconductor switch 17 to the drain terminal of the low-side semiconductor switch 20. The semiconductor switch half-bridges comprising the semiconductor switches arranged in parallel with respect to one another in accordance with FIG. 4, namely the high-side semiconductor switch 17 and the low-side semiconductor switch 20, which jointly form a semiconductor switch half-bridge, can thus be connected to an electrical voltage source by means of the busbar 27.

Figure 5:
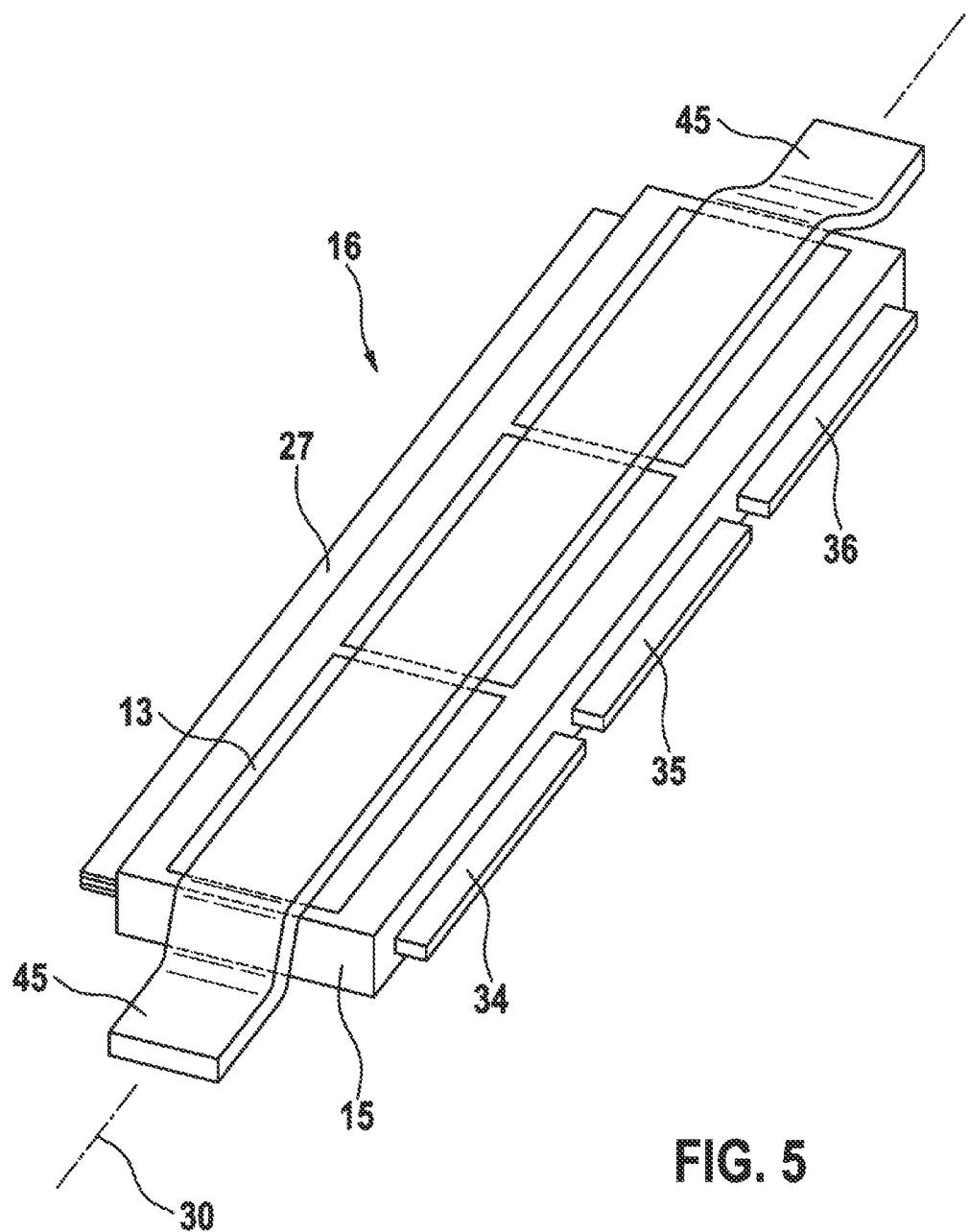
FIG. 5 shows a further production step for forming a power module comprising the components illustrated in FIG. 4, wherein the components are embedded in moulding compound.

FIG. 5 shows a production step for producing the power module, in which moulding compound is used to mould around the semiconductor arrangement shown in FIG. 4 in such a way that the busbar 27 and the output terminals 34, 35 and 36 project from the moulded body 15 formed by the—in particular fully polymerized—moulding compound.

FIG. 5 also shows a variant in which the power module is thermally conductively connected to a heat sink, a cooling body 45 in this example. The insulation layer 13 is thermally conductively contacted by the cooling body, in particular cooling plate, such that heat loss can be dissipated by the cooling body 45. The cooling body 45 can for example be connected to a heat pipe, or itself be formed by a heat pipe.

Figure 6:
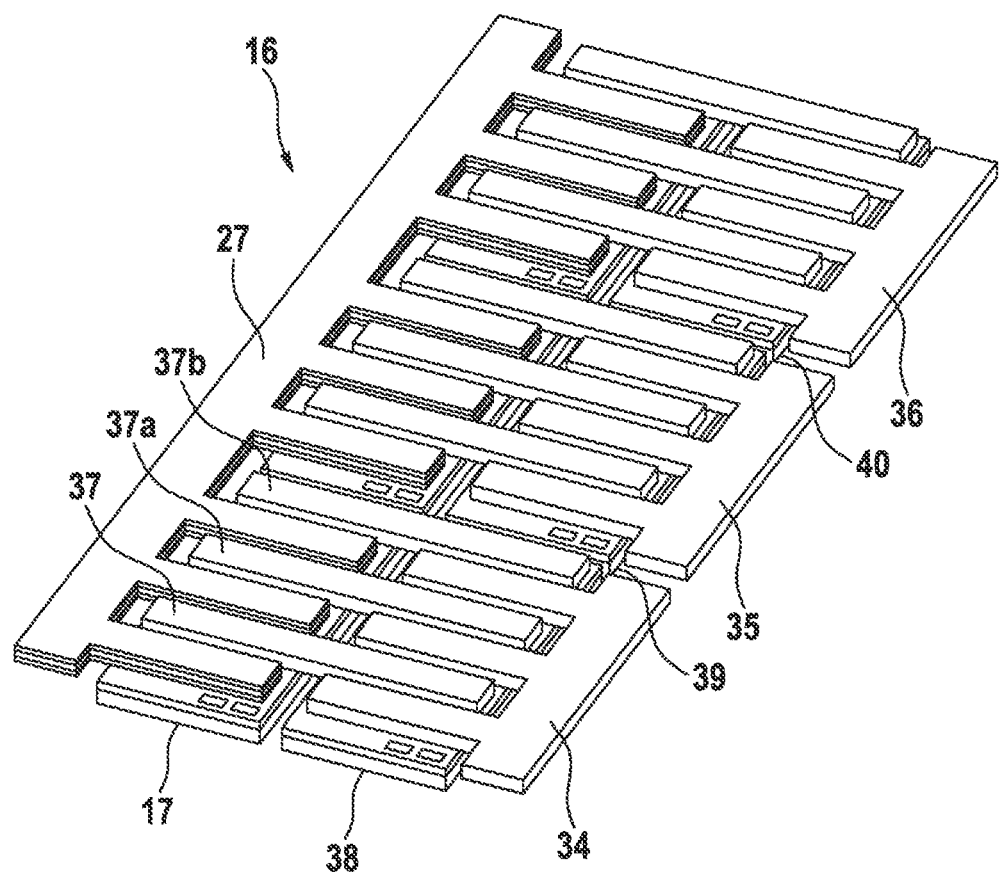
FIG. 6 shows a variant of the semiconductor arrangement illustrated in FIG. 4, in which the half-bridges are connected to a phase disconnecting switch on the output side.

FIG. 6 shows a variant of the semiconductor arrangement illustrated in FIGS. 2, 3 and 4, in which the semiconductor switch half-bridges are in each case connected to a phase disconnecting switch on the output side. In this exemplary embodiment, the phase disconnecting switch is formed by a field effect transistor, in particular corresponding to the high-side semiconductor switch 17.

The high-side semiconductor switches such as the semiconductor switch 17, 18 and 19 are in each case arranged with their flat extension in the same plane as the phase disconnecting switches, namely a phase disconnecting switch 38 connected to the output of the high-side semiconductor switch 17 on the input side, a phase disconnecting switch 39 connected, on the input side, to the half-bridge comprising the high-side semiconductor switch 18, and a phase disconnecting switch connected, on the input side, to the output of the half-bridge comprising the high-side semiconductor switch 19 and the low-side semiconductor switch 22.

The semiconductor arrangement 16 comprises an electrically conductive connection element 37 for the purpose of connecting the phase disconnecting switch 38 to the high-side semiconductor switch 17, said connection element being embodied as longitudinally extending contact fingers in this exemplary embodiment.

The connection element 37 is formed for example as in particular stamped or laser-cut sheet metal, in particular copper sheet, and engages by an end section between the contact fingers 32 and 32a of the busbar 27 and can thus electrically contact the source terminal 25 between the contact fingers 32 and 32a. The connection element 37 thus contacts the source terminal 25 instead of the contact finger 33—in the semiconductor arrangement 16 in FIG. 2. An end section of the connection element 37 is connected to a switching path terminal of the phase disconnecting switch 38 by soldering, such that the source terminal 25 of the semiconductor switch 17, which together with the drain terminal 24 of the low-side semiconductor switch 20 forms the already mentioned output of the semiconductor switch half-bridge, is connected to the phase disconnecting switch 38.

The semiconductor arrangement 16 also comprises the output terminal 34, which is connected to a switching path terminal of the phase disconnecting switch 38 in the semiconductor arrangement 16.

The semiconductor arrangement 16 also comprises a connection element 37a, which extends with an end section between the contact finger 32a and the contact finger 32b, and a further connection element 37b, which extends in a manner arranged adjacently to the contact finger 32b. The connection elements 37, 37a and 37b thus form an output of the semiconductor switch half-bridge comprising the high-side semiconductor switch 17 and the low-side semiconductor switch 20 and connect said semiconductor switch half-bridge to the phase disconnecting switch 38. The busbar 27 and the connection elements such as the connection element 37 and the output terminals 34, 35 and 36 are in each case arranged in a common plane.

Figure 7:
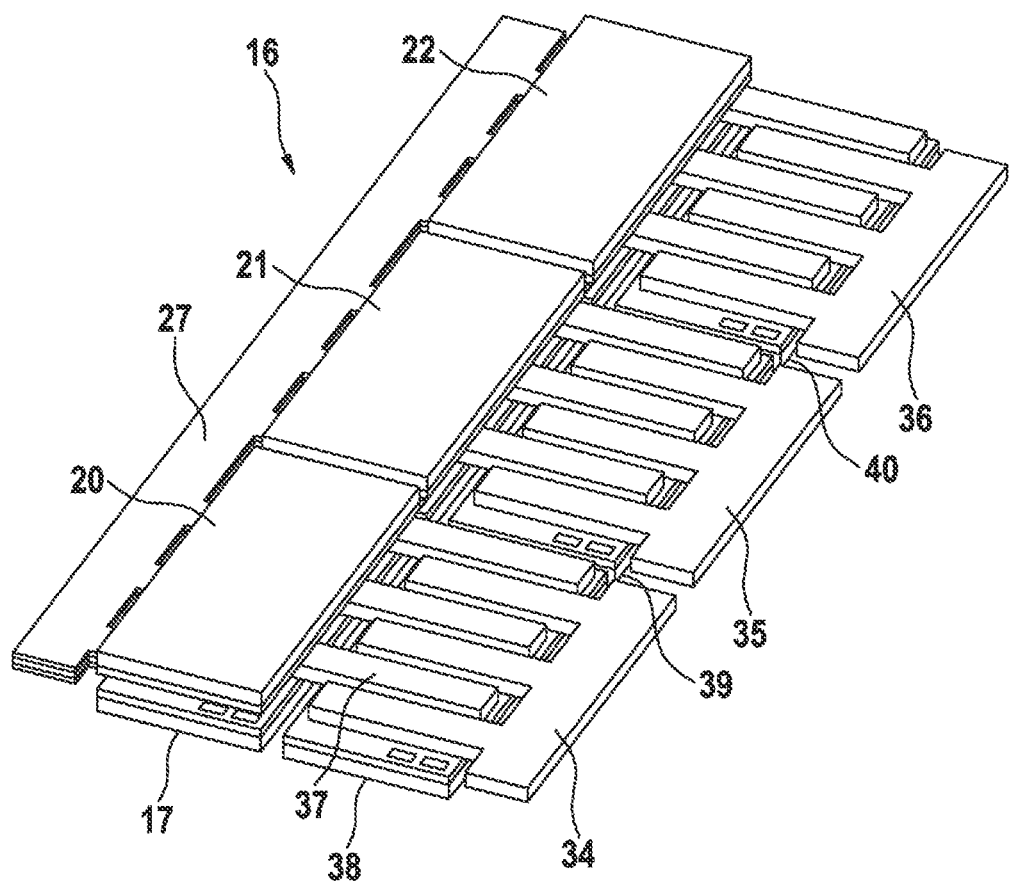
FIG. 7 shows a production step for producing a power module with phase disconnecting switches, in which low-side semiconductor switches are soldered onto electrical terminals.

FIG. 7 shows a further production step for producing the power module, comprising the semiconductor arrangement 16, in which in FIG. 7 the low-side semiconductor switch 20 is arranged opposite the high-side semiconductor switch 17, the low-side semiconductor switch 21 is arranged opposite the high-side semiconductor switch 18, and the low-side semiconductor switch 22 is arranged opposite the high-side semiconductor switch 19. The low-side semiconductor switches 20, 21 and 22 are supplied with voltage in each case via the busbar 27, in particular the electrically conductive layer 28, wherein the drain terminals as output terminal are electrically connected to the connection elements such as the connection element 37. The low-side semiconductor switches 20, 21 and 22 can in each case be soldered to the busbar 27 and to the connection element such as the connection element 37 by means of reflow soldering.

Figure 8:
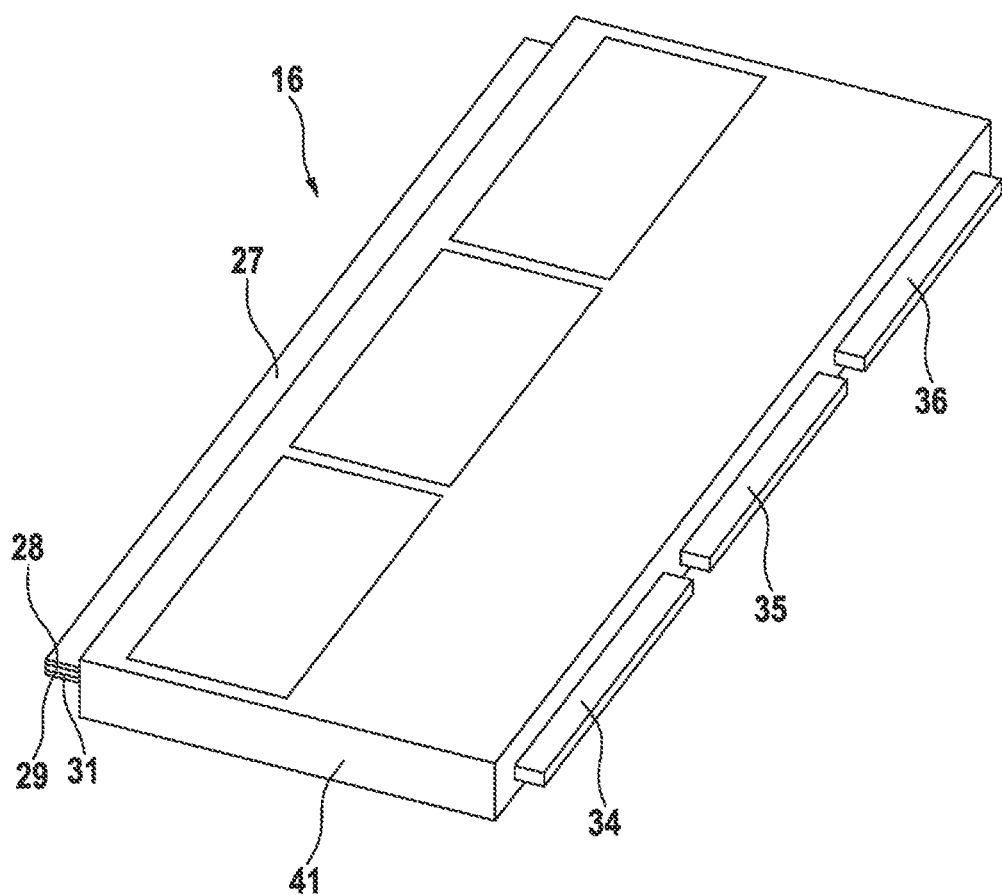
FIG. 8 shows a production step for producing a power module with phase disconnecting switches, in which the components shown in FIG. 7 are embedded in moulding compound.

FIG. 8 shows the power module in which the semiconductor arrangement 17 shown in FIG. 7 is embedded by means of a moulding compound in such a way that the busbar 27 and the output terminals 34, 35 and 36 project from a moulded body 41 formed by the moulding compound.

The invention claimed is:

1. A power module for an electric motor, comprising:
at least one semiconductor switch half-bridge including:
a plurality of semiconductor switches;
an output terminal; and
at least one electrically conductive layer,
wherein:
the plurality of switches includes a high-side semiconductor switch and a low-side semiconductor switch;
each semiconductor switch has a respective switching path terminal formed by a respective flat surface region of the semiconductor switch;
the switching path terminal of each semiconductor switch faces in a same direction;
the at least one electrically conductive layer is enclosed between the high-side semiconductor switch and the low-side semiconductor switch, and electrically connects the respective switching path terminal of the low-side semiconductor switch and the respective switching path terminal of the high-side semiconductor switch of the half-bridge to each other; and
the output terminal of the half-bridge is formed by the at least one electrically conductive layer.

2. The power module according to claim 1, wherein the respective switching path terminals of the plurality of semiconductor switches of a half-bridge are arranged so as to be opposite one another.

3. The power module according to claim 1, wherein the power module is configured to enable polyphase switching and has at least one or only one semiconductor switch half-bridge assigned to each phase.

4. The power module according to claim 1, wherein:
the at least one electrically conductive layer has:
a phase busbar; and
at least one contact finger integrally formed in a flat extension of the at least one electrically conductive layer onto the phase busbar,
the at least one contact finger points away from the phase busbar transversely or has a transverse component; and
the at least one contact finger connects to each other the respective switching path terminals of a subset of the plurality of semiconductor switches that are connected to the output terminal.

5. The power module according to claim 1, wherein:
each of the plurality of semiconductor switches is formed by a respective field effect transistor;
the respective switching path terminal of the high-side semiconductor switch is connected to the output terminal of the half-bridge, and is a source terminal; and
the respective switching path terminal of the low-side semiconductor switch is connected to the output terminal of the half-bridge, and is a drain terminal.

6. The power module according to claim 1, wherein:
each of the plurality of semiconductor switches is formed by a respective insulated gate bipolar transistor;
the respective switching path terminal of the high-side semiconductor switch is connected to the output terminal of the half-bridge, and is an emitter terminal; and
the respective switching path terminal of the low-side semiconductor switch is connected to the output terminal of the half-bridge, and is a collector terminal.

7. The power module according to claim 1, further comprising:
a busbar; and
at least one contact finger integrally formed onto the busbar, wherein the at least one contact finger electrically contacts a respective switching path terminal configured to supply power to the half-bridge.

8. The power module according to claim 7, wherein:
the at least one contact finger has a plurality of layers that includes:
an electrically insulating insulation layer; and
two electrically conductive layers arranged parallel to each other and separated from each other by the electrically insulating insulation layer;
wherein the plurality of layers of the at least one contact finger contact mutually opposite terminals of mutually different semiconductor switches of the plurality of semiconductor switches.

9. The power module according to claim 7, wherein:
the at least one electrically conductive layer has:
a phase busbar; and
at least one further contact finger integrally formed in a flat extension of the at least one electrically conductive layer onto the phase busbar;
the at least one further contact finger points away from the phase busbar transversely or has a transverse component;
the at least one further contact finger connects to each other the respective switching path terminals of a subset of the plurality of semiconductor switches that are connected to the output terminal;
the at least one contact finger of the busbar and the at least one further contact finger of the phase busbar and of the output terminal in each case intermesh.

10. The power module according to claim 1, wherein the power module is embedded into a moulded body.

11. The power module according to claim 8, wherein the electrically insulating layer includes a dielectric.

* * * * *

UNITED STATES PATENT AND TRADEMARK OFFICE
CERTIFICATE OF CORRECTION

PATENT NO. : 10,505,489 B2
APPLICATION NO. : 15/779240
DATED : December 10, 2019
INVENTOR(S) : Erich Ilic et al.

Page 1 of 1

It is certified that error appears in the above-identified patent and that said Letters Patent is hereby corrected as shown below:

On the Title Page

At "(22) PCT Filed:"
Replace "Nov. 17, 2016"
With --Oct. 17, 2016--

Signed and Sealed this
Thirty-first Day of March, 2020

Andrei Iancu
*Director of the United States Patent and Trademark Office*